(12) United States Patent
Lee et al.

(10) Patent No.: US 7,180,190 B2
(45) Date of Patent: Feb. 20, 2007

(54) ELECTRODE LINE STRUCTURE HAVING FINE LINE WIDTH AND METHOD OF FORMING THE SAME

(75) Inventors: Joo-won Lee, Suwon (KR); Kang-soo Chu, Suwon (KR); Jae-eun Park, Yongin (KR); Jong-ho Yang, Seoul (KR)

(73) Assignee: Samsung Electronics, Co., Ltd. (KR)

( * ) Notice: Subject to any disclaimer, the term of this patent is extended or adjusted under 35 U.S.C. 154(b) by 0 days.

(21) Appl. No.: 10/612,096

(22) Filed: Jul. 2, 2003

(65) Prior Publication Data

US 2004/0056292 A1    Mar. 25, 2004

(30) Foreign Application Priority Data

Sep. 19, 2002    (KR) .................. 10-2002-0057462

(51) Int. Cl.
  *H01L 23/48*    (2006.01)
  *H01L 27/108*    (2006.01)
(52) U.S. Cl. ................ 257/758; 257/296; 257/763

(58) Field of Classification Search ................ 257/296, 257/750, 758, 763, 764, 773
See application file for complete search history.

(56) References Cited

U.S. PATENT DOCUMENTS 6,770,974 B2 *   8/2004   Ejiri ........................ 257/758

\* cited by examiner

*Primary Examiner*—Ori Nadav
(74) *Attorney, Agent, or Firm*—Mills & Onello LLP

(57) ABSTRACT

In an electrode line structure of a semiconductor device and a method for forming the same, the electrode line structure comprises a semiconductor substrate, and electrode lines, which are formed on the semiconductor substrate, and have an inclined end in the long axis direction. The electrode lines each include a first line unit, which substantially functions as an electrode line, a second line unit, which has an inclined end in the long axis direction and is separated from the first line unit by a predetermined distance, and an insulating plug, which is interposed between the first line unit and the second line unit and electrically insulates the first line unit from the second line unit.

8 Claims, 5 Drawing Sheets

ELECTRODE LINE STRUCTURE HAVING FINE LINE WIDTH AND METHOD OF FORMING THE SAME

BACKGROUND OF THE INVENTION

This application claims the priority of Korean Patent Application No. 2002-57462 filed on Sep. 19, 2002, in the Korean Intellectual Property Office, the disclosure of which is incorporated herein in its entirety by reference.

1. Field of the Invention

The present invention relates to a semiconductor device and a method of manufacturing the same, and more particularly, to an electrode line structure having a fine line width and a method of forming the same.

2. Description of the Related Art

As the integration density of semiconductor devices increases, fine circuit patterns having a fine line width or electrode lines having a fine line width are required. In particular, electrode lines such as word lines or bit lines are of the most widely used lines in a DRAM (dynamic random access memory) device, and the line width of the electrode lines is considered to be the barometer of the level of integration and performance of the highly-integrated semiconductor device.

Generally, electrode lines are formed by patterning a conductive layer via a photolithography process using an exposure-based optical system capable of achieving high-resolution.

However, as the integration density of the semiconductor devices increases exponentially, it is desirous for the word lines and the bit lines to have a line width not larger than the exposure limit, which results in the following problems.

With reference to FIGS. 1A to 1C, as shown in FIG. 1A, a conductive layer 12 and a hard mask layer 14 are deposited on an upper portion of a semiconductor substrate 10 in order to form electrode lines, for example, word lines. Thereafter, photoresist patterns 16 for defining the word lines are formed by a known photolithography process. The expected line width of the word lines is not larger than the exposure limit, and is currently about 0.1 µm. However, if the photoresist patterns 16 having a line width not larger than the exposure limit are disposed at fine intervals, edges of upper portions of the photoresist patterns 16 become rounded due to the proximity effect and due to the photo-interference generated when exposing the photoresist patterns 16. As a result, side walls of the photoresist patterns 16 tend to become inclined.

The hard mask layer 14 and the conductive layer 12, which are formed under the photoresist patterns 16, are patterned using the above photoresist patterns 16 to form word lines 20. Since the word lines 20 thus formed have the same profile as the photoresist patterns 16, edges of upper portions of the word lines 20 are rounded, and side walls of the word lines 20 are inclined.

The side walls of the word lines 20 are inclined not only in the channel length direction (short axis direction of the word lines 20), as shown in FIG. 1B, but also in the channel width direction (long axis direction of the word lines 20), as shown in FIG. 1C. After removing the photoresist patterns 16 using a known method, an insulating layer for a spacer (not shown) is deposited on an upper portion of the resultant structure in order for a subsequent self-aligned contact step to be performed. Then, the insulating layer to be formed into a spacer is etched by an anisotropic blanket etching method to form a spacer 22. Since the side walls of the word lines 20 become inclined during the etching step for forming the spacer 22, the insulating layer formed on the inclined side walls of the word lines 20 is exposed to a large amount of anisotropic etching gas. Therefore, as shown in FIG. 1C, only a small amount of the spacer 22 remains on a portion of the side walls of the word lines 20. The spacer 22 may be even partially removed at a portion of the inclined side walls of the word lines 20, thereby exposing a portion of the word lines 20. Particularly, in the case where the word lines 20 are made of a material that is susceptible to the wet etching chemical, such as SC1 (standard chemical 1), for example, a material containing tungsten, large portions of the word lines 20 are removed during the subsequent wet etching step. A line defect is therefore generated in the semiconductor device due to the removal of a large portion of the word lines 20.

FIG. 2 is a SEM (scanning electron microscope) photograph of a conventional gate line, and FIG. 3 is a photograph of a plan view of a conventional semiconductor device.

In a case where the word lines 20 are formed using the photoresist patterns 16 having the fine line width and the fine space, it can be seen from FIG. 2 that the side walls of the word lines 20 are inclined. In FIG. 2, reference character A represents the inclined surface of the side walls.

When a subsequent etching step is preformed in the case where a portion of the spacer 22 has been removed, it can be seen from FIG. 3 that a portion of the word lines 20 are also removed. In FIG. 3, reference character B represents defects of a line shape indicating the removed portion of the word lines 20.

SUMMARY OF THE INVENTION

The present invention provides an electrode line structure capable of preventing electrode lines of a semiconductor device from becoming partially removed.

The present invention also provides a method of forming such an electrode line structure.

According to an aspect of the present invention, there is provided an electrode line structure of a semiconductor device comprising a semiconductor substrate; and electrode lines, which are formed on the semiconductor substrate and have an inclined end in the long axis direction. In the present invention, the electrode lines each include a first line unit, which substantially functions as an electrode line, a second line unit, which includes the inclined end in the long axis direction and is separated from the first line unit by a predetermined distance, and an insulating plug, which is interposed between the first line unit and the second line unit and electrically insulates the first line unit from the second line unit.

Further, the length of the electrode lines is greater than the ordinary length of conventional electrode lines by a predetermined length. The insulating plug is formed at a predetermined position of each of the electrode lines such that the first line unit has the ordinary length. The length of the second line unit is greater than the width of the electrode lines, and less than the ordinary length.

The first line unit and the second line unit comprise a conductive layer and a hard mask layer, respectively. The conductive layer is, for example, made of a material containing tungsten. The hard mask layer is, for example, made of a silicon nitride layer or a silicon oxynitride layer. A spacer is formed on an inclined end in the long axis direction of the second line unit. The insulating plug can formed of the same material as the spacer. The electrode lines comprise, for example, word lines or bit lines.

According to another aspect of the present invention, there is provided a method of forming an electrode line structure of a semiconductor device. The method comprises depositing a conductive layer on a semiconductor substrate; depositing a hard mask layer on the conductive layer; patterning the hard mask layer and the conductive layer to form electrode lines; forming a hole of a line shape in a predetermined portion of each of the electrode lines to cut the electrode lines, thereby defining a first line unit and a second line unit that are electrically insulated from each other; depositing an insulating layer for a spacer in the hole and on the electrode lines; and etching the insulating layer using an anisotropic blanket etching method to form a spacer at an edge of the electrode lines.

BRIEF DESCRIPTION OF THE DRAWINGS

The above and other features and advantages of the present invention will become more apparent by describing in detail preferred embodiments thereof with reference to the attached drawings in which.

DETAILED DESCRIPTION OF PREFERRED EMBODIMENTS

Figure 1A:
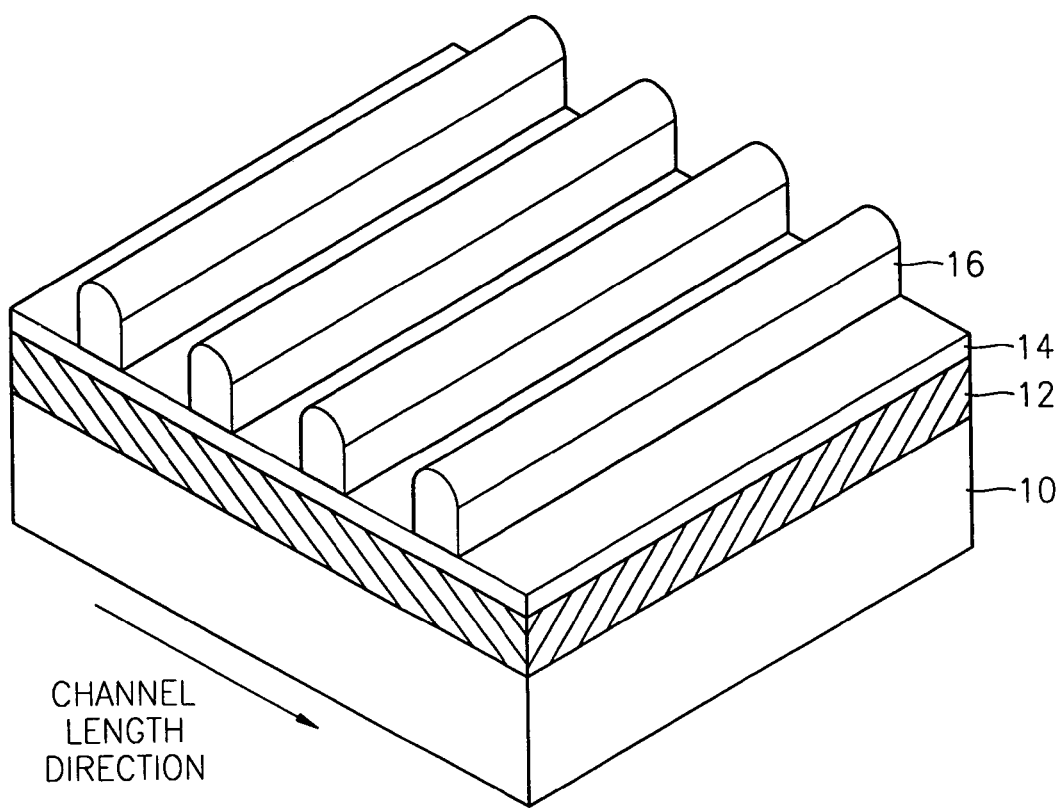
FIGS. 1A to 1C are elevated views of an electrode line structure of a conventional semiconductor device.
Figure 1B:
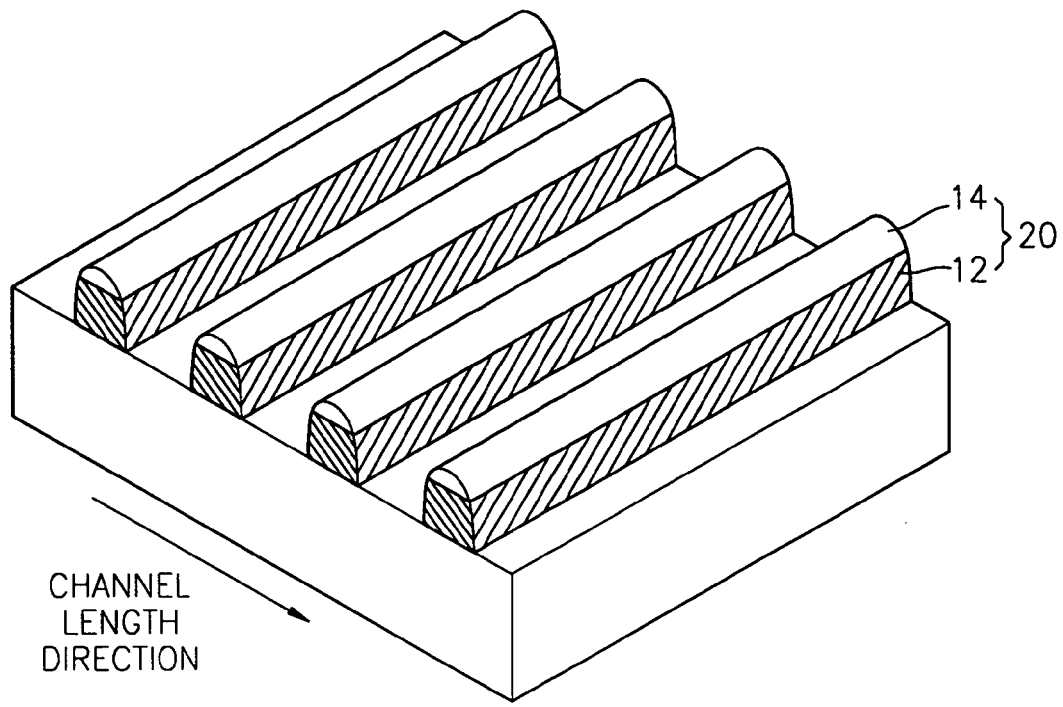
Figure 1C:
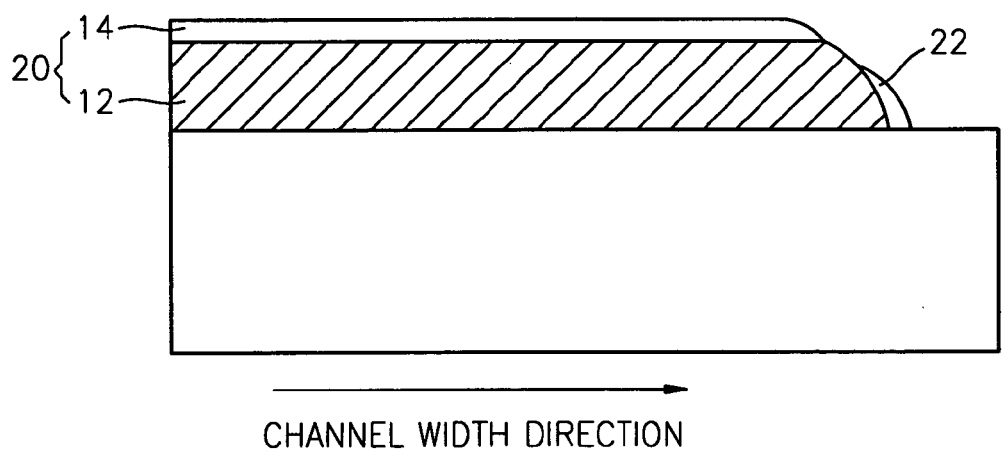
Figure 2:
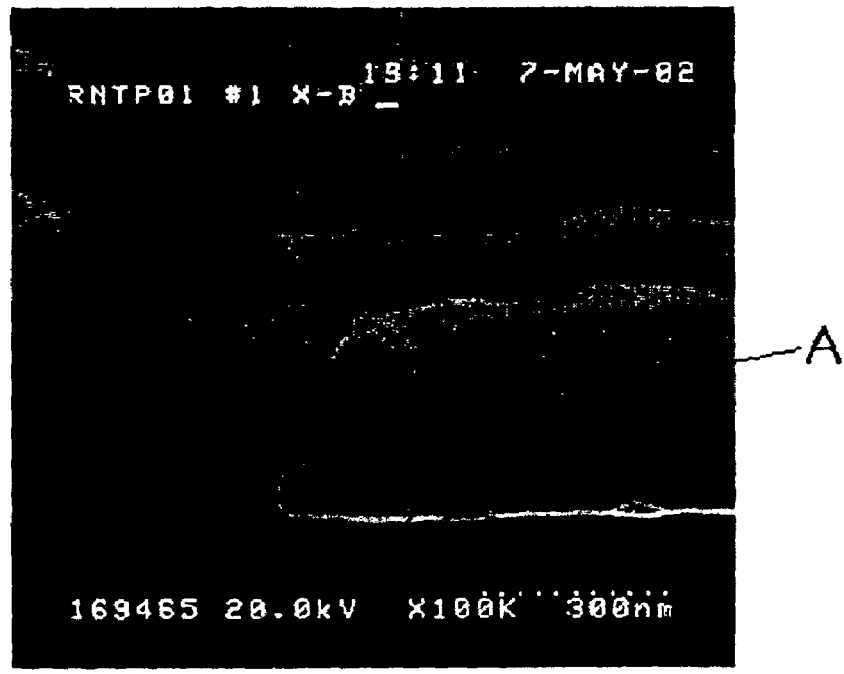
FIG. 2 is a SEM (scanning electron microscope) photograph of conventional gate lines.
Figure 3:
FIG. 3 is a photograph of a plan view of a conventional semiconductor device.

The present invention will now be described more fully with reference to the accompanying drawings, in which preferred embodiments of the invention are shown. This invention may, however, be embodied in many different forms and should not be construed as being limited to the embodiments set forth herein. Rather, these embodiments are provided so that this disclosure will be thorough and complete and will fully convey the concept of the invention to those skilled in the art. In the drawings, the thicknesses of layers and regions are exaggerated for clarity. It will also be understood that when a layer is referred to as being "on" another layer or substrate, it can be directly on the another layer or substrate, or intervening between the another layer and the substrate represent the same elements, and thus their descriptions will not be repeated.

<Embodiment 1>

Figure 4:
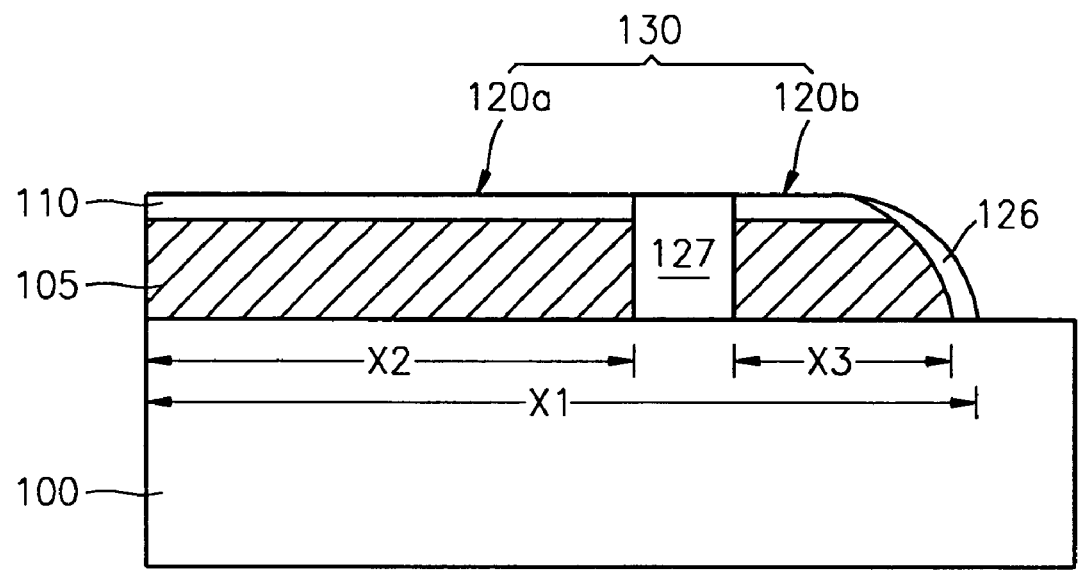
FIG. 4 is a cross-sectional view of an electrode line structure of a semiconductor device according to a first embodiment of the present invention.

Referring to FIG. 4, electrode lines 130 are formed on an upper portion of a semiconductor substrate 100. The semiconductor substrate 100 may, for example, comprise a bare silicon substrate, or an insulating layer may be formed on the semiconductor substrate 100. The electrode lines 130 may, for example, comprise word lines or bit lines.

As in the conventional example, since the electrode lines 130 having a fine line width are disposed at fine intervals, the side walls of the electrode lines 130 are inclined. In a case where word lines are used as the electrode lines 130 in the present embodiment, the length X1 in the long axis direction of the electrode lines 130, that is, in the channel width direction, is greater than the ordinary length X2 of conventional word lines by a predetermined length. Insulating plug 127 is formed within each of the electrode lines 130. The insulating plug 127 is formed at a predetermined position along the line that is capable of defining the ordinary length X2, so that the insulating plug 127 divides each of the electrode lines 130 into a first line unit 120A, which substantially functions as an electrode line, and a second line unit 120B including an inclined side wall portion. The insulating plug 127 cuts or bisects the electrode line 130 into the first and second line units 120A, 120B. Here, the length X3 of the second line unit 120B is greater than the width of the electrode lines 130 or less than the ordinary length X2.

The electrode lines 130 each include a conductive layer 105 and a hard mask layer 110. A tungsten metal layer or a tungsten silicide layer may be used as the conductive layer 105. A silicon nitride layer may be used as the hard mask layer 110.

A spacer 126 is formed at the side walls of the electrode lines 130 by a known method. Since the spacer 126 is thinly formed at the side walls of the electrode lines 130, particularly, on the inclined side wall of the second line unit 120B, or is partially removed, the conductive layer 105 may be partially exposed. Thus, the second line unit 120B may be affected by a wet etching chemical through the exposed conductive layer 105 in a subsequent wet etching step, and as a result, the conductive layer 105 may be removed. However, since the second line unit 120B, which is insulated from the first line unit 120A by the insulating plug 127 interposed therebetween, is, in essence, a dummy pattern, the first line unit 120A, which substantially functions as a line, is not affected by the properties of the second line unit 120B, even though the conductive layer 105 of the second line unit 120B may be partially removed, or entirely removed. Further, since the conductive layer 105 of the first line unit 120A is surrounded, at the top portion by the hard mask layer 110, and at the side portion by the insulating plug 127, the conductive layer 105 of the first line unit 120A is prevented from being removed during the subsequent wet etching step.

Considering that the side walls of the electrode lines 130 are inclined when the electrode lines 130 having the fine line width are formed, the length of the electrode lines 130 is greater than the ordinary length by the predetermined length in the electrode line structure according to the present invention. Then, the insulating plug 127 is formed within each of the electrode lines 130 so that the electrode lines 130 are each divided into the first line unit 120A, which substantially functions as a line, and the second line unit 120B, which has an edge having an inclined side wall and which functions as a dummy pattern.

Thus, even though the conductive layer 105 of the second line unit 120B may be exposed, and as a result, may be removed by the wet etching chemical during wet etch, the first line unit 120A, which substantially functions as a line, is not affected, and thus operational defects in the electrode lines 130 are prevented.

(Embodiment 2)

Figure 5A:
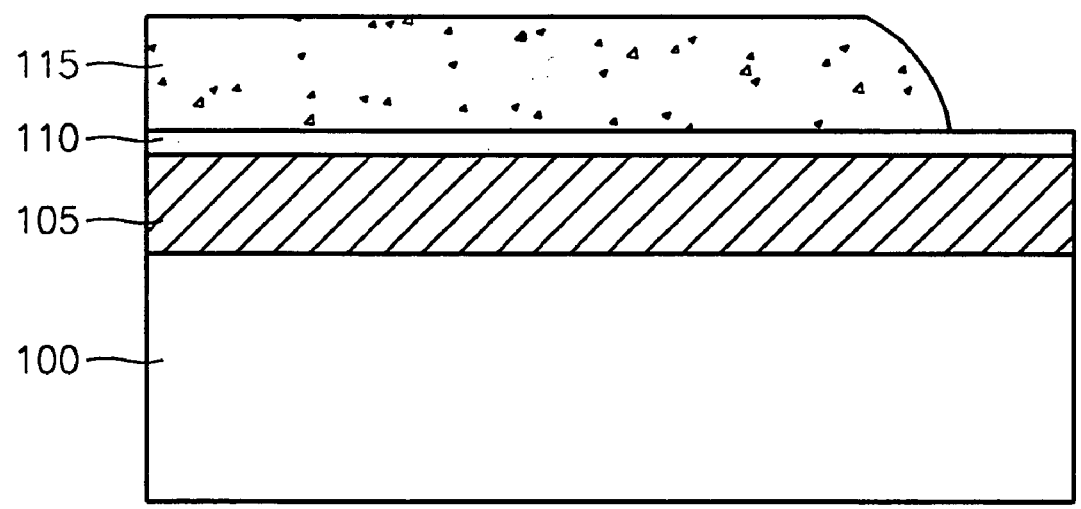
FIGS. 5A to 5C are cross-sectional views showing a method of forming an electrode line structure of a semiconductor device according to a second embodiment of the present invention.
Figure 5B:
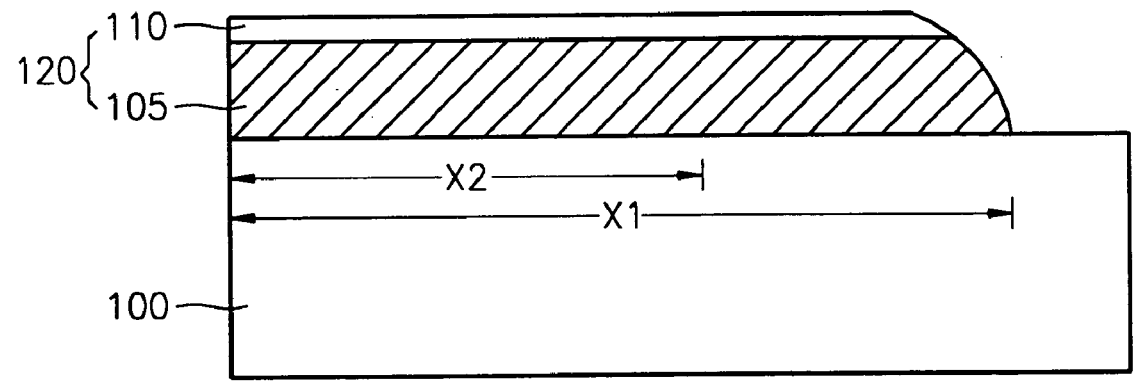
Figure 5C:
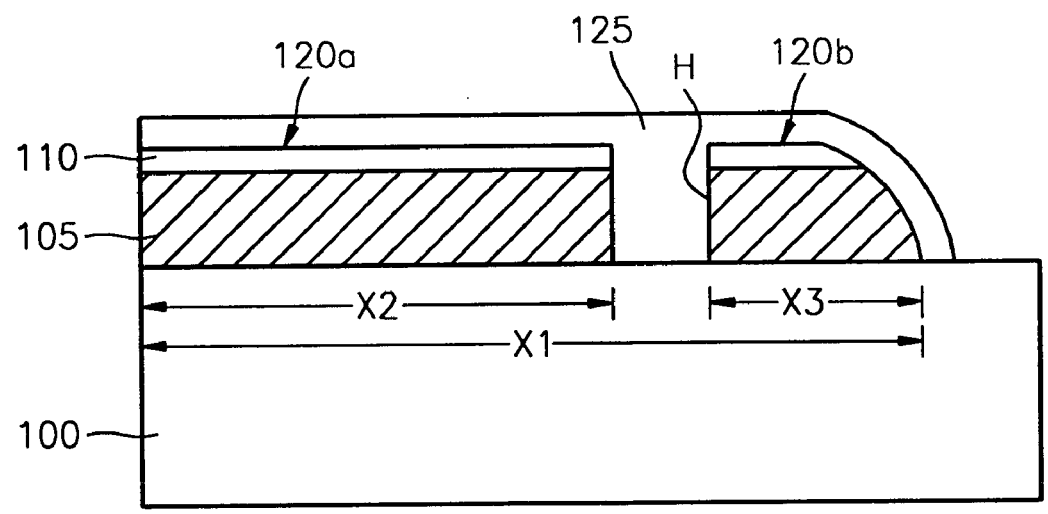

FIGS. 5A to 5C are cross-sectional views showing a method of forming an electrode line structure of a semiconductor device according to a second embodiment of the present invention. In the present embodiment, the electrode lines are used as word lines.

Referring to FIG. 5A, a conductive layer 105 for word lines is formed on an upper portion of a semiconductor substrate 100. A gate insulating layer (not shown) is formed between the semiconductor substrate 100 and the conductive layer 105. A tungsten metal layer or a tungsten silicide layer may be used as the conductive layer 105. A hard mask layer 110 is formed on an upper portion of the conductive layer 105. The hard mask layer 110 electrically protects the word lines during a subsequent step of forming a self-aligning contact, and may be formed of a silicon nitride layer or a silicon oxynitride layer. Thereafter, photoresist patterns 115 are formed by a known photolithography process in order to define the word lines having a fine line width and disposed at fine intervals. Edges of upper portions of the photoresist patterns 115 are removed due to the proximity effect and due to the photo-interference generated during the photolithography process, resulting in side walls of the photoresist patterns 115 being inclined, as described above.

Referring to FIG. 5B, the hard mask layer 110 and the conductive layer 105 are patterned using the photoresist patterns 115 as a mask to form word lines 120. Since the word lines 120 are patterned using the photoresist patterns 115 as a mask, the shape of the word lines 120 is modeled after the shape of the photoresist patterns 115. Thereafter, the photoresist patterns 115 are removed. The length X1 of the word lines 120 is preferably greater than the ordinary length X2 of conventional word lines.

As shown in FIG. 5C, a predetermined portion of each word line 120 is etched to form a hole H. Further, the hole H divides each of the word lines 120 into a first line unit 120A and a second line unit 102B, as described above. The first line unit 120A has the ordinary length X2 and substantially functions as a word line. The second line unit 102B has an inclined outer edge surface, and is electrically insulated from the first line unit 120A. Thereafter, an insulating layer 125 for a spacer is deposited on the resulant structure. The width of the hole H may be less than two times the thickness of the insulating layer 125 so that the hole H is sufficiently buried by the insulating layer 125. Next, the insulating layer 125 is etched by an anisotropic blanket etching method to form a spacer 126 (refer to FIG. 4).

As described above, according to the present invention, considering that the outer side walls of the electrode lines are inclined when electrode lines having a fine line width are formed, the electrode lines of the present invention preferably have a length that is greater than the ordinary length of the conventional electrode lines. Then, the insulating plug or the hole is formed within each of the electrode lines so that the electrode lines are each divided into the first line unit, which substantially functions as a line, and the second line unit which has an edge having an inclined side wall functioning as a dummy pattern.

Thus, even though the conductive layer of the second line unit may be exposed, and as a result may be removed by the wet etching chemical, the first line unit, which substantially functions as a line, is not affected, and thus the defects in the electrode lines are prevented.

While the present invention has been particularly shown and described with reference to preferred embodiments thereof, it will be understood by those of ordinary skill in the art that various changes in form and details may be made therein without departing from the spirit and scope of the present invention as defined by the appended claims.

What is claimed is:

1. An electrode line structure of a semiconductor device comprising:
   a semiconductor substrate; and
   electrode lines on the semiconductor substrate, the electrode lines each having an inclined outer end in the long axis direction, wherein each electrode line comprises a conductive layer and a hard mask layer;
   wherein the electrode lines comprise one of word lines and bit lines of the semiconductor device, and wherein the electrode lines each includes a first line unit, which substantially functions as an electrode line, and a second line unit, which includes the inclined outer end in the long axis direction and which is separated from the first line unit by a hole that is formed through the conductive layer and the hard mask layer of each electrode line, wherein the hole has a width between a hard mask layer portion of the first line unit and a hard mask layer portion of the second line unit, the width being substantially the same as a width between a conductive layer portion of the first line unit and a conductive layer portion of the second line unit and wherein each electrode line further includes an insulating plug which is positioned in the hole between the first line unit and the second line unit and electrically insulates the first line unit from the second line unit, the insulating plug having an upper surface that is at a same level as the upper surface of the hard mask layer portion of the first line unit and the upper surface of the hard mask layer portion of the second line unit, wherein the insulating plug has a width between the hard mask layer portion of the first line unit and the hard mask layer portion of the second line unit, the width being substantially the same as a width between the conductive layer portion of the first line unit and the conductive layer portion of the second line unit.

2. The electrode line structure of claim 1, wherein a first length (X1) of the electrode lines is greater than a second length (X2) by at least a predetermined third length (X3).

3. The electrode line structure of claim 2, wherein the insulating plug is formed at a predetermined position of each of the electrode lines such that the first line unit has the second length (X2).

4. The electrode line structure of claim 2, wherein the third length (X3) is the length of the second line unit and is greater than a width of the electrode lines and less than the second length (X2).

5. The electrode line structure of claim 1, wherein the conductive layer comprises a material containing tungsten.

6. The electrode line structure of claim 1, wherein the hard mask layer comprises a silicon nitride layer or a silicon oxynitride layer.

7. The electrode line structure of claim 1, wherein a spacer is formed on the inclined outer end in the long axis direction of the second line unit.

8. The electrode line structure of claim 7, wherein the insulating plug is formed of a material of which the spacer is formed.

* * * * *